United States Patent [19]
Betti et al.

[11] Patent Number: 5,418,494
[45] Date of Patent: May 23, 1995

[54] VARIABLE GAIN AMPLIFIER FOR LOW SUPPLY VOLTAGE SYSTEMS

[75] Inventors: Giorgio Betti, Milan; David Moloney, Cornaredo; Salvatore Portaluri, Pavia, all of Italy

[73] Assignee: SGS-Thomson Microelectronics, S.r.l., Agrate Brianza, Italy

[21] Appl. No.: 221,640

[22] Filed: Mar. 31, 1994

[30] Foreign Application Priority Data

Apr. 6, 1993 [EP] European Pat. Off. ............ 93830147

[51] Int. Cl.⁶ .......................... H03F 3/45; H03G 3/30
[52] U.S. Cl. ..................... 330/254; 330/283
[58] Field of Search ............ 330/254, 283, 295; 348/678, 707

[56] References Cited

U.S. PATENT DOCUMENTS 3,891,937  6/1975  Bockelmann et al. ............... 330/254

FOREIGN PATENT DOCUMENTS 0117404  5/1987  Japan ................... 330/254

OTHER PUBLICATIONS

IEEE Journal of Solid-State Circuits, vol. 24, No. 4, Aug. 1989, New York US, pp. 951-961, Tzu-Wang Pan E. A. 'a 50-dB variable gain amplifier using parasitic bipolar transistors in CMOS.' *pp. 957-959, chapter 4: "IV. A variable gain amplifier"* *FIG. 9*.
Patent Abstracts of Japan, vol. 15, No. 169 (P-1196) Apr. 26, 1991 & JP-A-30 33 989 (NEC Corp.) Feb. 14, 1991 *abstract*.

Primary Examiner—Steven Mottola
Attorney, Agent, or Firm—Robert Groover

[57] ABSTRACT

A variable gain amplifier which includes a first voltage-to-current amplifier having a fixed gain; a second voltage-to-current amplifier having a variable gain, functioning in parallel to said first amplifier; a gain control and stabilization variable current generator; and a current-to-voltage converter. Current output signals produced by said first and second amplifiers and by said variable current generator are summed and the resulting current signal is converted to a voltage signal by said converter.

39 Claims, 3 Drawing Sheets

VARIABLE GAIN AMPLIFIER FOR LOW SUPPLY VOLTAGE SYSTEMS

CROSS REFERENCE TO RELATED APPLICATION

This application claims priority from EPC App'n 93830147.0, filed Apr. 6, 1993, which is hereby incorporated by reference.

BACKGROUND OF THE INVENTION

The present invention relates to a variable gain amplifier (VGA) particularly suited for automatic gain control systems (AGC).

Typically, automatic gain control (AGC) systems are implemented by employing a variable gain amplifier (VGA), a detector (a peak or average value detector) capable of providing an information on the signal level in the loop, a bidirectional current generator driven by the detector, and finally a capacitor for stabilizing the loop and constituting an analog memory of the system. A system of this type is schematically shown in FIG. 1.

Characterizing performance parameters of a variable gain amplifier (VGA), may be listed as follows:

Frequency band
Range of variation of the gain
Maximum level of the input signal
Maximum level of the output signal
Linearity
Output offset
Equivalent input noise
Supply voltage requirement Specific requirements dictated by the particular field of application and therefore different performance parameters determine the choice among numerous amplifier circuits, suitable to be integrated on silicon.

In order to implement an automatic gain control before a demodulation stage of the Intermediate Frequency block of a TV receiver, it is necessary to provide for a range of variation of the gain of about 60 dB. Therefore, it is often necessary to employ a chain of several amplifying stages in cascade. On the other hand, in consideration of the band characteristics of the processed TV signal, the coupling between the various stages is usually implemented in an AC mode. Therefore, the output offset that was mentioned above among other merit parameters of a VGA, loses its relevance in this case. A typical amplifier structure that is employed in integrated TV circuits for implementing a VGA is shown in FIG. 2.

If the control current: Icont=0, the gain of the stage is almost equal to the ratio 2RL/RE, where RE is the total emitter-degeneration resistance. By increasing Icont, the diodes turn on and, by adding their own impedance: 1/gm, in parallel to the modules that make up RE, modify (decrease) the gain.

Conversely, in the case of an automatic gain control implementation in a read/write channel of a hard disk, a typical set of performance parameters of a variable gain amplifier suited for this type of application may be indicated as follows:

Frequency band: from 0 to 30 MHz
Gain variation: from 4 to 80 Volt/Volt (26 dB)
Input signal: from 12 mVpp to 250 mVpp (differential)
Output signal: from 1.0 Vpp to 3 Vpp (differential)
Linearity: better than 40 dB (Distortion<1%)
Output offset: less than ±400 mV
Equivalent input noise: <15 nV/sqrt(Hz)
Supply voltage: from 4.5 V to 5.5 V In view of the relatively limited variation of the gain that is required (26 dB), a typical VGA structure that is customarily used for such an application, is constituted by a single variable gain stage "cell", followed by a fixed gain stage, typically having a gain of 10–20 Volt/Volt.

A variable gain stage that is commonly used in these applications is shown in FIG. 3. It utilizes a common circuit known as "double Gilbert multiplier circuit", which permits to vary in a continuous fashion the gain by controlling the balance in the upper quadrants and by approximately maintaining constant the DC operating point throughout the range of gain variation.

Such a known circuit has the advantage of neutralizing the Miller effect of multiplication of a parasitic base/collector capacitance, representing in practice a cascode (grounded-base) configuration. This permits achievement of a broad band characteristic.

The integration of a read/write "channel" in a single chip and the increase of the data transfer speed have made even more stringent the requirements for the VGA to be employed, as may be set forth by the following values of required performance parameters:

Frequency band: from 0 to 50 MHz
Gain variation: from 2 to 22 Volt/Volt (21 dB)
Input signal: from 20 mVpp to 240 mVpp (differential)
Output signal: maximum 1.1 Vpp (differential)
Linearity: better than 40 dB (Distortion <1%)
Output offset: less than ±200 mV
Equivalent input noise: <15 nV/sqrt(Hz)
Supply voltage: from 4.3 V to 5.5 V The broadening of the frequency band that is required because of an increased data transfer speed, has made necessary the use of a further cascode stage for further decreasing the parasitic capacitance of the gain control resistance, according to the diagram shown in FIG. 4.

More recent developments of hard disk memory systems have imposed a further tightening of the design parameters of the VGA to be used in these state of the art systems.

Nowadays, hard disk memories are no longer exclusively installed in fixed installations, but increasingly often they are installed in portable (battery operated) instruments and the power consumption has assumed a critical importance. Moreover, these modern systems tend to be faster and faster.

As a consequence, read/write systems must be compatible with a relatively low supply voltage of about 3 Volt, the required frequency band may be up to about 80 MHz because of increase speed while the other parameters may remain practically unchanged. A sample specification of a VGA for this type of applications, characterized by a relatively low supply voltage, may be as follows:

Frequency band: from 0 to 80 MHz
Gain variation: from 2.7 to 33 Volt/Volt (22 dB)
Input signal: from 20 mVpp to 240 mVpp (differential)
Output signal: maximum 0.75 Vpp (differential)
Linearity: better than 40 dB (Distortion<1%)

Output offset: less than ±200 mV
Equivalent input noise: <15 nV/sqrt(Hz)
Supply voltage: from 3 V to 5.5 V VGA circuits that have been employed so far, fall short of reaching these performances. By considering, following example, the circuit of FIG. 4, it may be seen that this circuit is unable to provide a sufficiently wide dynamic range, capable of ensuring a correct operation with a 3 Volt supply.

SUMMARY OF THE INVENTIONS

The main aim of the present invention is to provide a variable gain amplifier (VGA) having particularly high dynamic characteristics and a broad frequency band though working with a relatively low supply voltage.

The present invention advantageously provides a variable gain amplifier circuit capable of satisfying such a primary requirement of a large output dynamic characteristic even under relatively low supply voltage and a broad frequency band that makes it particularly suited for battery operated portable hard disk memory systems.

Basically, the variable gain amplifier of the invention is composed of a first voltage-to-current, fixed gain amplifier together with a voltage-to-current, variable gain amplifier that operates in parallel with the first amplifier. A variable current generator permits to stabilize the DC operating point of the amplifier while varying the gain.

In practice, the current output of the three component blocks is summed before being converted back to a voltage signal by a current-to-voltage converter.

The converter may be functionally constituted by two load elements, for example by two load resistances, through which the sum current flows.

According to a preferred embodiment of the invention, the sum of the output current signals of the three circuit blocks may be performed by employing a summing circuit. A suitable summing circuit may be conveniently made of a transistor connected in a cascode configuration (i.e. a grounded-base configuration), so that an emitter node of the transistor may provide a desired low impedance node onto which the three different current signals may be summed. Of course, this summing circuit is not strictly necessary and under particular conditions may also be omitted, without jeopardizing the functioning of the VGA.

BRIEF DESCRIPTION OF THE DRAWINGS

The invention will now be described by referring to the attached drawings which show an important embodiment of the invention and which are incorporated herein by express reference.

DETAILED DESCRIPTION

Figure 5:
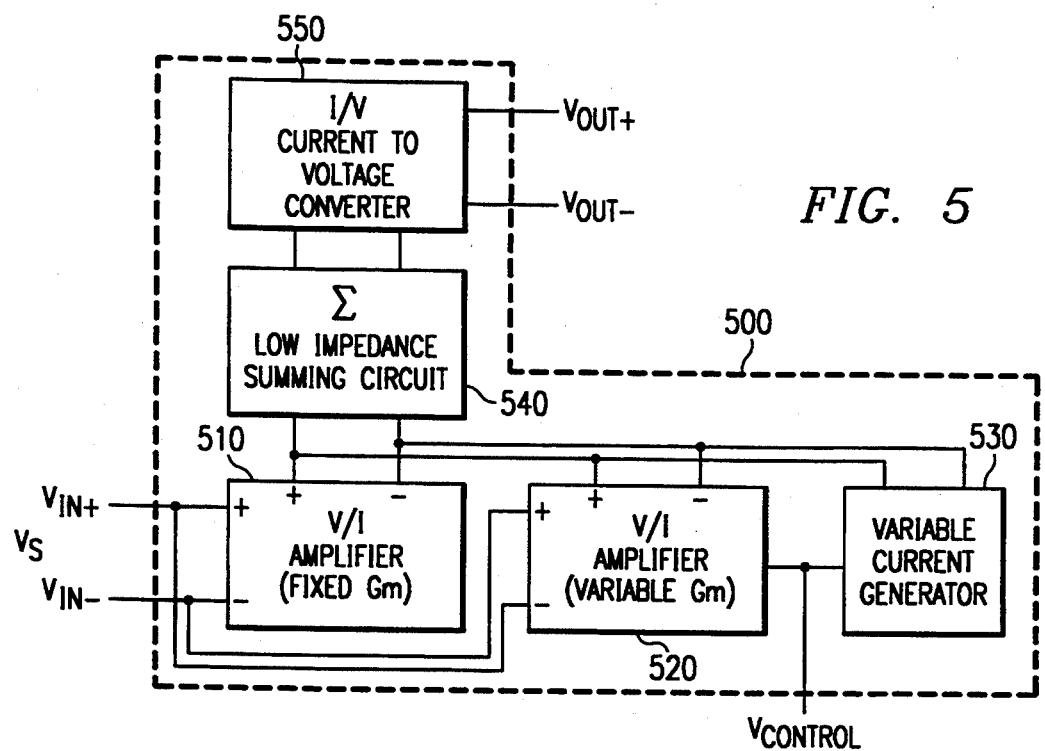
FIG. 5 is a block diagram of a VGA made according to the present invention.

The improved structure of a sample VGA amplifier provided by the invention is shown in the form of a block diagram in FIG. 5. The VGA structure (500) comprises a first voltage-to-current (V/I) amplifier (510) having a fixed gain (fixed Gm) and a second voltage-to-current (V/I) amplifier (520) having a variable gain (variable Gm) which operates in parallel with the first amplifier. The output currents of the first amplifier and of the second amplifier are summed together and with a third current signal that is generated by a variable current generator (VARIABLE CURRENT GENERATOR) (530) which is driven by a control voltage ($V_{CONTROL}$).

Preferably, as already mentioned before and schematically shown in FIG. 5, a summing circuit (540) (Σ) may be used between the outputs of the three circuit blocks and a current-to-voltage converter (IN) (550), in order to provide a low impedance node onto which performing the sum of the output currents.

Therefore, a current-to-voltage (IN) converter (550) converts into a voltage signal the resulting sum of the output current signals of the three blocks (510, 520, 530).

Figure 6:
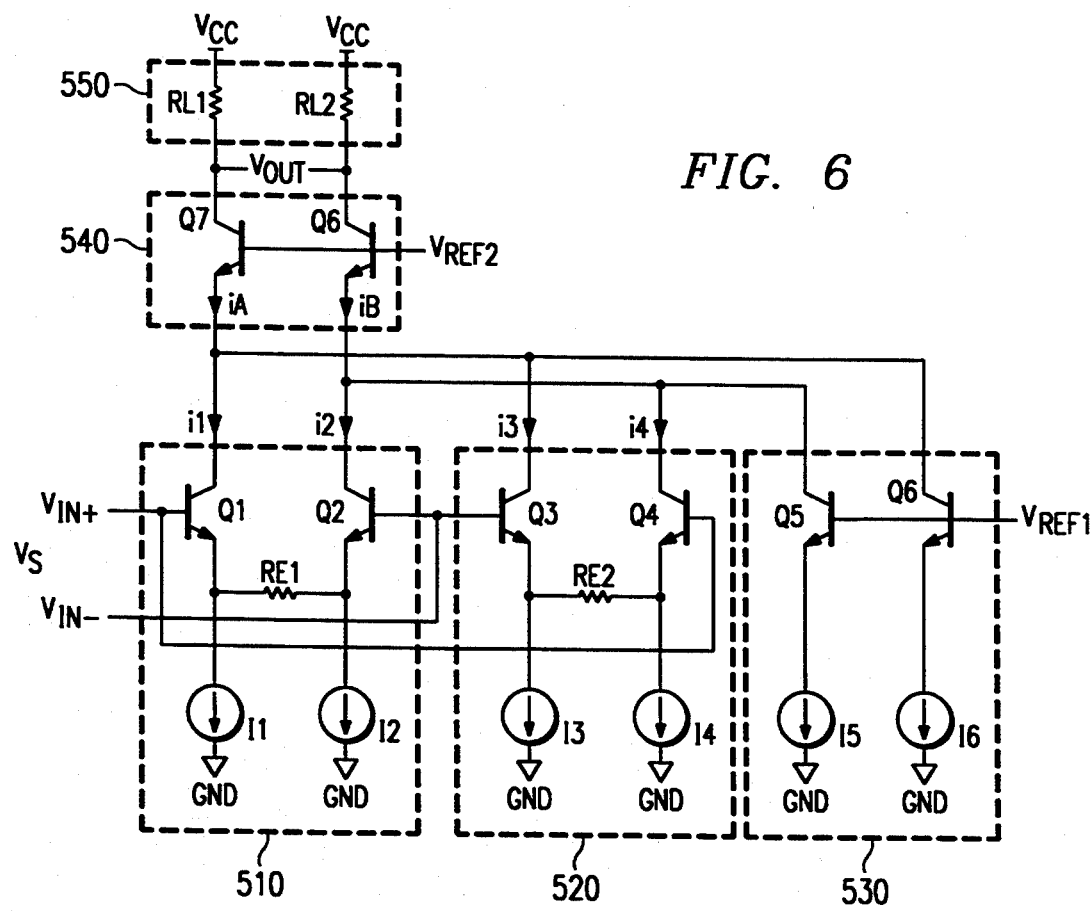
FIG. 6 is a simplified circuit diagram of a variable gain amplifier of the invention.

A preferred embodiment of the invention is depicted in FIG. 6.

By referring to FIG. 6, a first voltage-to-current amplifier (510) having a fixed gain is constituted by the differential pair of transistors Q1 and Q2, that is emitter-degenerated by the resistance RE1. A fixed biasing current Iφ is forced through the differential pair by a pair of constant current generators I1 and I2.

The diffential pair of transistors Q3 and Q4, emitter-degenerated by the resistance RE2, constitutes a second voltage-to-current amplifier (520) that operates in parallel with the first amplifier composed of the pair Q1 and Q2. The second amplifier (520) operating in parallel with the first (510), has a variable gain. The variation of the gain of the second amplifier (520) takes place by subtracting to a biasing current I0 that is generated by two respective current generators I3 and I4, a certain variable current: DELTAI. A generator of a variable current DELTAI (530) is composed of the pair of transistors Q5 and Q6 that are controlled by the voltage Vref1, and of the current generators I5 and I6. Vref1 has the function of ensuring that the DC biasing conditions at the output be constant upon the varying of the gain (i.e., upon the varying of DELTAI), notwithstanding the fact that the β and the current gain of bipolar transistors is finite and there is an inevitable loss of current, passing from the emitter to the collector. The pair of transistors Q5 and Q6 is employed for this purpose. Their function is to provide a reduction of the current that is introduced in the final stage, proportional to the variation of the current gain, in order that a perfect congruence be maintained among what is passed through the first, the second and the third pair of transistors. Vref1 has the only scope of appropriately biasing transistors Q5 and Q6. In order to optimize second order effects due to the variation of the base-collector voltage Vref1 must be chosen equal to the rest voltage of the inputs Vin+ and Vin−. In this way it will ensure that the behavior of the transistors that share a common base voltage Vref1 will be, from the point of view of their current gain, similar to the behavior of Q1 and Q2 of the first differential stage.

As will be well understood by those skilled in the art, the current relationship can be readily implemented in the operation-wise using matched devices.

The pair of transistors Q7 and Q8, (constructing the block 540) in a grounded-base configuration (cascode), has a double function. A first function is that of providing a low impedance node, such as the emitter node of the cascode-configured transistors Q7 and Q8, on which the output currents of the three circuit blocks described above may be summed, that is the output currents of the voltage-to-current, fixed gain amplifier (Q1–Q2), of the voltage-to-current, variable gain amplifier (Q3–Q4) and of the variable current generator (Q5–Q6), respectively.

A second function is that of reducing the parasitic capacitance present on the output nodes, which, in absence of the cascode pair Q7–Q8, would be equal to the sum of the parasitic capacitances of three transistors, for example of Q1, Q3 and Q6 on one node and of Q2, Q4 and Q5 on the other node. Moreover, the cascode pair Q7–Q8 eliminates the Miller effect of multiplication of the parasitic capacitance by the gain.

The pair Q7–Q8 is controlled by a voltage Vref2. A sample value for Vref2 would be in the vicinity of 2.5 V.

By referring to the identifying symbols of the components of the circuit of the invention, as depicted in FIG. 6, the gain may be calculated as follows:

$$gm_1 = gm_2 = \frac{Io}{Vt}$$

$$gm_3 = gm_4 = \frac{I}{Vt}$$

(gm is the transconductance of the relative transistor for small signals; Vt is the "thermal" voltage that is equal to 0.026 V at T=27°.)

$$I = Io - DELTAI$$

$$i_1 = \frac{vs}{2} * \left( \frac{gm_1}{1 + gm_1 \frac{Re1}{2}} \right)$$

$$i_2 = -\frac{vs}{2} * \left( \frac{gm_1}{1 + gm_1 \frac{Re1}{2}} \right)$$

$$i_3 = -\frac{vs}{2} * \left( \frac{gm_3}{1 + gm_3 \frac{Re2}{2}} \right)$$

$$i_4 = \frac{vs}{2} * \left( \frac{gm_3}{1 + gm_3 \frac{Re2}{2}} \right)$$

$$i_A = i_1 + i_3$$
$$i_B = i_2 + i_4$$

$$i_A = \frac{vs}{2} * \left( \frac{gm_1}{1 + gm_1 \frac{Re1}{2}} - \frac{gm_3}{1 + gm_3 \frac{Re2}{2}} \right)$$

-continued $$i_B = -\frac{vs}{2} * \left( \frac{gm_1}{1 + gm_1 \frac{Re1}{2}} - \frac{gm_3}{1 + gm_3 \frac{Re2}{2}} \right)$$

$$vout = (i_A - i_B) * R_L$$

$$vout = vs * \left( \frac{gm_1}{1 + gm_1 \frac{Re1}{2}} - \frac{gm_3}{1 + gm_3 \frac{Re2}{2}} \right) * R_L$$

$$G = \frac{vout}{vs}$$

$$G = 2R_L * \left( \frac{gm_1}{2 + gm_1 Re1} - \frac{gm_3}{2 + gm_3 Re2} \right)$$

$$G = 2R_L * \left( \frac{Io}{2Vt + Io\,Re1} - \frac{I}{2Vt + I\,Re2} \right)$$

$$G = 2R_L * \left( \frac{Io}{2Vt + Io\,Re1} - \frac{Io - DELTAI}{2Vt + (Io - DELTAI)Re2} \right)$$

$$G(DELTAI) =$$

$$2R_L * \frac{[Io(Re2 - Re1)(Io - DELTAI) + 2Vt\,DELTAI]}{(2Vt + Io\,Re1)[2Vt + (Io - DELTAI)Re2]}$$

$$GMAX = G(DELTAI = Io) = 2R_L * \frac{(Io)}{2Vt + Io\,Re1}$$

$$GMIN =$$

$$G(DELTAI = 0) = 2R_L * \frac{[Io^2 (Re2 - Re1)]}{(2Vt + Io\,Re1)(2Vt + Io\,Re2)}$$

$$\frac{GMAX}{GMIN} = \frac{(2Vt + Io\,Re2)}{Io\,(Re2 - Re1)}$$

This last formula permits to easily observe that the range of variation of the gain required by the specification that was reported above (22 dB) may be obtained with the following values:

I0=200 μA
RE1=2000 ohm
RE2=2200 ohm

To ensure that the gain will not become null in a preferred embodiment, the degeneration resistances are chosen different from each other. Therefore, for a current of Iφ of 200 μA, the current DELTAI may assume any value between 0 and 200 μA. Of course, a DELTAI equal to zero will produce the maximum gain while a DELTAI=200 μA will produce a certain minimum gain (different from 0).

The third functional block of the amplifier of the invention (530), which is constituted by the variable current generator (Q5–Q6) has also the function of maintaining constant the DC operating point upon the varying of the gain. In order to achieve this result, to the current signals that are summed on the emitter nodes of the cascode stages Q7 and Q8 a complementary current equal to:

IcompI=DELTAI is added.

The total current that flows through the load resistances RL1 and RL2 in absence of an input signal, once a value for DELTAI has been fixed, is equal to:

$$I_{TOT} = Io + (Io\text{-}DELTAI) + (DELTAI) = 2Io$$

and because it does not depend from DELTAI it is independent also from the set gain.

Figure 1:
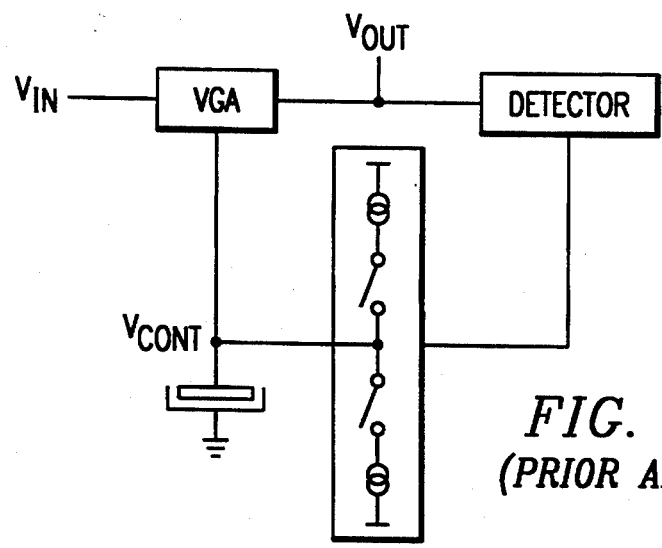
FIG. 1 shows a functional block diagram of an automatic gain control system employing a variable gain amplifier (VGA), as already mentioned above.
Figure 2:
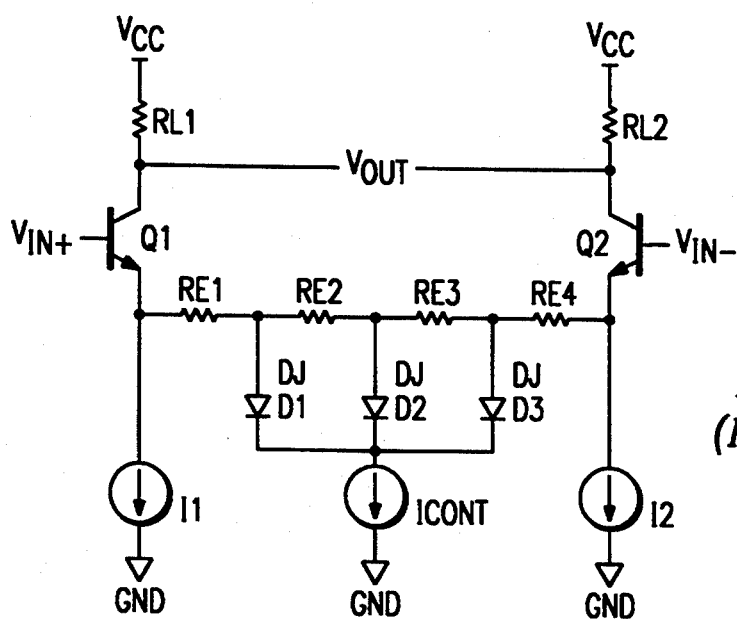
FIG. 2 shows a circuit diagram of a variable gain "cell" (or stage) that is commonly used for realizing a VGA, as already mentioned above.
Figure 7:
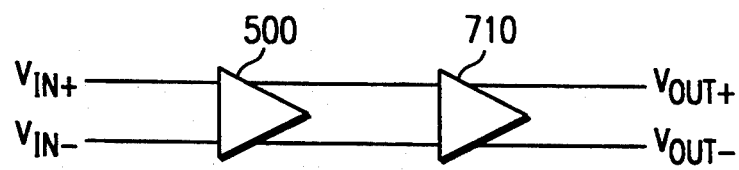
FIG. 7 is a block diagram of an application of the present invention in which a VGA is followed by an additional amplifier.
Figure 3:
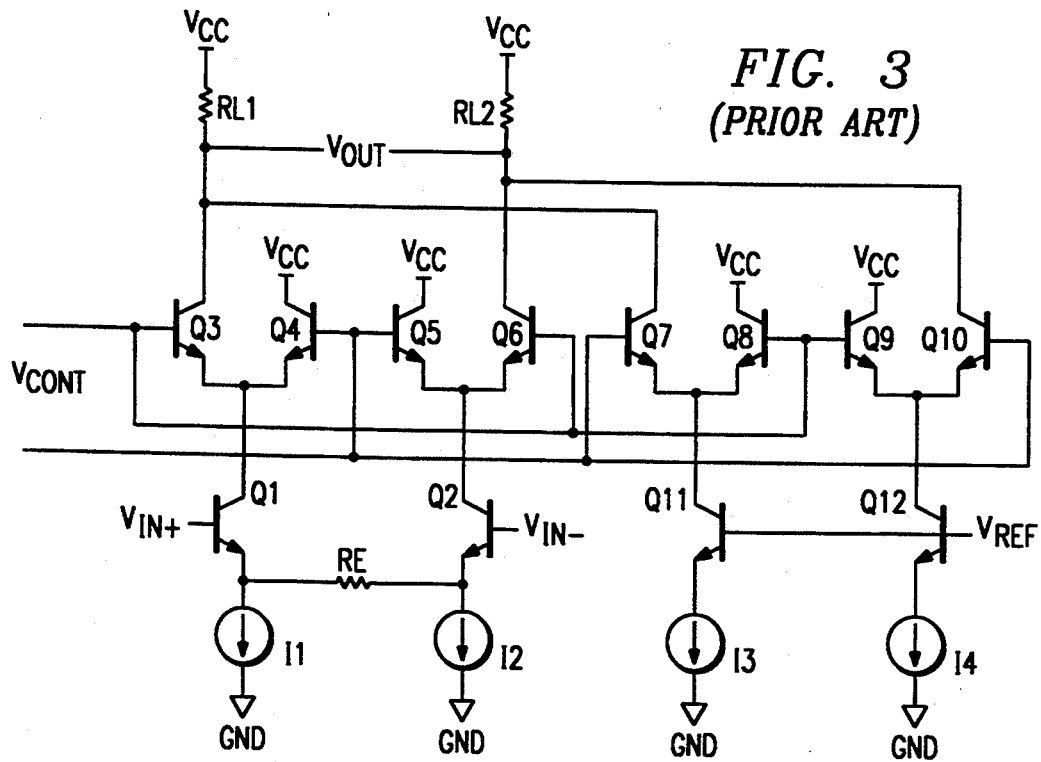
FIG. 3 shows a variable gain "cell" employing a double Gilbert multiplier, according to another known solution, as already described above.
Figure 4:
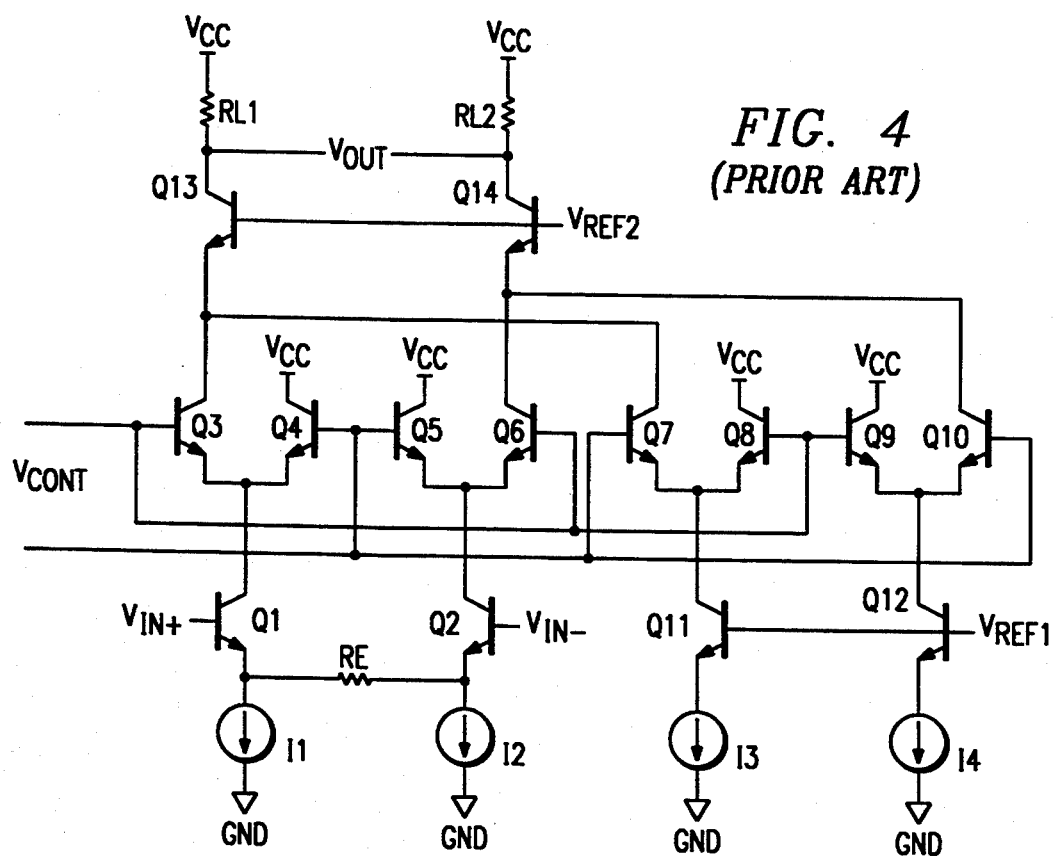
FIG. 4 shows a circuit similar to that of FIG. 3, wherein a cascode stage is added in order to decrease the parasitic capacitance of the gain control resistance, as already described above.

Of course, in order to achieve gain levels that will satisfy the proposed specification of a variable gain amplifier for the type of application considered, the variable gain amplifier, that is the variable gain "cell", object of the present invention, may be followed by a fixed gain amplifier, for example a 10 Volt/Volt amplifier, as shown in FIG. 7. The variable gain in amplifier (500) of the present invention and an additional amplifier (710) operate as two amplifying stages in cascade. The additional amplifier (710) may be also a second variable gain amplifier according to the invention.

By simulating the operation of the circuit of the invention with a computer program for evaluating the performance parameters at a supply voltage of 3 V, the following results are obtained:

Typical frequency band >160 MHz
Gain variation: from 2.7 to 34 Volt/Volt (22 dB)
Distortion <0.7% with an input of 240 mVpp
Output offset: less than ±200 mV
Equivalent input noise: <12 nV/sqrt(Hz)
Absorbed supply current Icc=1.6 mA As will be evident to one of ordinary skill in the art, the circuit object of the present invention may be realized with junction-type, bipolar transistors or in mixed technology by employing for example CMOS transistors for implementing the current generators, or the entire functional circuit of the variable gain cell of the invention may also be realized exclusively with field effect transistors (CMOS) in order to further reduce power consumption. Moreover, a single-ended implementation could be a possible embodiment in particular types of applications.

What is claimed is:

1. A variable gain amplifier, comprising:
   a first voltage-to-current amplifier having a fixed gain;
   a second voltage-to-current amplifier having a variable gain, functioning in parallel to said first amplifier;
   a variable current generator, connected to provide a variable current which varies with the gain of said second amplifier;
   a current-to-voltage converter;
   current output signals produced by said first and second amplifiers and by said variable current generator being summed and the resulting current signal being converted by said converter;
   whereby said variable current prevents any change in offset current due to changed gain of said second amplifier.

2. A variable gain amplifier according to claim 1, further comprising a summing circuit capable of providing a low impedance node onto which said current output signals are summed.

3. A variable gain amplifier according to claim 2, wherein said summing circuit comprises a pair of cascode configured transistors, functionally connected between respective output nodes of said first and second amplifiers and of said variable current generator and respective loads, which constitute said current-to-voltage converter.

4. A variable gain amplifier as defined in claim 1, wherein said first amplifier is composed of a first differential pair of transistors, a first degeneration resistance and a pair of fixed bias current generators, and said second amplifier is composed of a second differential pair of transistors, a second degeneration resistance and a pair of variable bias current generators.

5. A variable gain amplifier as defined in claim 1, wherein said first and second amplifiers and said variable current generator include bipolar junction transistors.

6. An integrated variable gain amplifier, comprising:
   a first amplifier block connected to receive first and second input voltage signals, and connected to produce a first output current on first and second output current terminals, the magnitude of said first output current being controlled by a fixed DC biasing current driving said first amplifier block so as to determine a fixed gain thereof;
   a second amplifier block connected to receive said first and second input voltage signals, and connected to produce a second output current on said first and second output current terminals, the magnitude of said second output current being controlled by a variable DC biasing current driving said second amplifier block so as to determine a variable gain thereof, the value of said variable DC biasing current being a combination of said fixed DC biasing current and of a variable current, controlled by an external control signal, and the DC part of said second output current depending only on said fixed DC biasing current.

7. An integrated variable gain amplifier according to claim 6, wherein said variable DC biasing current is the difference between said fixed DC biasing current and said variable current.

8. An integrated variable amplifier according to claim 6, wherein said fixed and variable DC biasing currents, and said variable current are provided by first, second and third pairs of current generators respectively.

9. An integrated variable gain amplifier according to claim 6, wherein said second amplifier block consists of a variable current generator, generating said variable current and being driven by the external control signal, and a variable amplifier controlled by said variable DC biasing current.

10. An integrated variable gain amplifier according to claim 9, wherein said first amplifier block comprises a first differential pair of transistors, a first degeneration resistance and a pair of fixed bias current generators, and wherein said variable amplifier comprises a second differential pair of transistors, a second degeneration resistance and a first pair of variable bias current generators.

11. An integrated variable gain amplifier according to claim 10, wherein said variable current generator comprises a third differential pair of transistors controlled by the external control signal and a second pair of variable bias current generators, generating a current which is the difference between the currents generated by said pair of fixed bias current generators and said first pair of variable bias current generators.

12. An integrated variable gain amplifier according to claim 6, further comprising a current to voltage converter, connected to said first and second output current terminals to produce an output voltage signal.

13. An integrated variable gain amplifier according to claim 12, wherein said current to voltage converter consists of first and second loads respectively connected to said first and second output current terminals.

14. An integrated variable gain amplifier according to claim 12, further comprising a summing circuit connected between said first and second output current terminals and said current to voltage converter, to produce a low impedance node at said first and second output current terminals whereat said first and second output currents are summed.

15. An integrated variable gain amplifier according to claim 14, wherein said summing circuit comprises a pair of cascode configured transistors.

16. An integrated variable gain amplifier according to claim 6, wherein said first and second amplifier blocks include bipolar junction transistors.

17. An integrated variable gain amplifier according to claim 6, wherein the supply voltage is about 3 Volt, whereby a frequency band wider than 160 MHz is provided.

18. An integrated variable gain amplifier, comprising:
a first differential pair of transistors, constituting a fixed gain amplifier, connected to receive an input voltage signal, a fixed gain being determined by a fixed biasing current flowing therethrough;
a second differential pair of transistors, constituting a variable gain amplifier, connected to receive said input voltage signal, a variable gain being determined by a variable biasing current flowing therethrough;
said first and second differential pairs of transistors being connected to operate in parallel;
a third differential pair of transistors, constituting a variable current generator, controlled by an external control signal to produce a complementary DC current, which varies in dependence on said variable biasing current;
said first, second and third differential pair of transistors being connected to combine first and second output current respectively from said first and second differential pair of transistors with said complementary DC current to stabilize the DC operating point of the circuit.

19. An integrated variable amplifier according to claim 18, wherein said variable biasing current is the difference between said fixed biasing current and said complementary DC current.

20. An integrated variable amplifier according to claim 18, wherein said fixed and variable biasing currents, and said complementary DC current are provided by first, second and third pairs of current generators respectively.

21. An intergrated variable gain amplifier according to claim 18, wherein said first differential pair of transistors are emitter degenerated by a first degeneration resistance and are connected to a pair of fixed bias current generators, and wherein said second differential pair of transistors are emitter degenerated by a second degeneration resistance and are connected to a first pair of variable bias current generators.

22. An integrated variable gain amplifier according to claim 21, wherein said variable current generator further comprises a second pair of variable bias current generators, generating a current which is the difference between the currents generated by said pair of fixed bias current generators and said first pair of variable bias current generators.

23. An integrated variable gain amplifier according to claim 18, further comprising a current to voltage converter, connected to receive a combination output current, combination of said first and second output currents from said first and second differential pairs of transistors with said complementary DC current, to produce an output voltage signal.

24. An integrated variable gain amplifier according to claim 23, wherein said combination output current is provided at first and second output current nodes, and wherein said current to voltage converter consists of first and second loads respectively connected to said first and second output current nodes.

25. An integrated variable gain amplifier according to claim 23, further comprising a summing circuit connected between a node whereat said combination output current is provided and said current to voltage converter, to produce a low impedance node at said first and second output terminals whereat said first and second output currents from said first and second differential pairs of transistors and said complementary DC current are summed.

26. An integrated variable gain amplifier according to claim 25, wherein said summing circuit comprises a pair of cascode configured transistors.

27. An integrated variable gain amplifier according to claim 18, wherein said transistors are bipolar junction transistors.

28. An integrated variable gain amplifier according to claim 18, wherein the supply voltage is about 3 Volt, whereby a frequency band wider than 160 MHz is provided.

29. An integrated variable gain amplifier, comprising:
a first differential pair of transistors, constituting a fixed gain amplifier, connected to receive an input voltage signal, a fixed gain being determined by a fixed biasing current flowing therethrough;
a second differential pair of transistors, constituting a variable gain amplifier, connected to receive said input voltage signal, a variable gain being determined by a variable biasing current flowing therethrough;
said first and second differential pair of transistors being connected to operate in parallel;
a third differential pair of transistors, constituting a variable current generator, controlled by an external control signal to produce a complementary DC current, which varies together with said variable biasing current;
said first, second and third differential pair of transistors being connected at first and second combination nodes to combine first and second output currents respectively from said first and second differential pair of transistors with said complementary DC current to stabilize the DC operating point of the circuit;
a pair of cascode configured transistors, connected between said first and second combination nodes to produce a low impedance node; and
first and second loads;
whereby said first and second loads and said pair of cascode configured transistors provide a voltage output with a desirable impedance at a node therebetween.

30. An integrated variable amplifier according to claim 29, wherein said variable biasing current is the difference between said fixed biasing current and said complementary DC current.

31. An integrated variable amplifier according to claim 29, wherein said fixed and variable biasing currents, and said complementary DC current are provided by first, second and third pairs of current generators respectively.

32. An integrated variable gain amplifier according to claim 29, wherein said first differential pair of transistors are emitter degenerated by a first degeneration resistance and are connected to a pair of fixed bias current generators, and wherein said second differential pair of transistors are emitter degenerated by a second degeneration resistance and are connected to a first pair of variable bias current generators.

33. An integrated variable gain amplifier according to claim 32, wherein said variable current generator further comprises a second pair of variable bias current generators, generating a current which is the difference between the currents generated by said pair of fixed bias current generators and said first pair of variable bias current generators.

34. An integrated variable gain amplifier according to claim 29, wherein said transistors are bipolar junction transistors.

35. An integrated variable gain amplifier according to claim 29, wherein the supply voltage is about 3 Volt, whereby a frequency band wider than 160 MHz is provided.

36. A variable gain amplifier system, comprising:
a variable gain cell, including:
a first amplifier block connected to receive first and second input voltage signals, and connected to produce a first output current on first and second output current terminals, the magnitude of said first output current being controlled by a fixed DC biasing current driving said first amplifier block so as to determine a fixed gain thereof;
a second amplifier block connected to receive said first and second input voltage signals, and connected to produce a second output current on said first and second output current terminals, the magnitude of said second output current being controlled by a variable DC biasing current driving said second amplifier block so as to determine a variable gain thereof, the value of said variable DC biasing current being a combination of said fixed DC biasing current and of a variable current, controlled by an external control signal, and the DC part of said second output current depending only on said fixed DC biasing current;
an additional amplifier;
said variable gain cell and said additional amplifier operating as two amplifying stages in cascade.

37. A variable gain amplifier system, according to claim 36, wherein said additional amplifier is a 10 volt/volt amplifier.

38. An automatic gain control system, comprising:
a variable gain amplifier, including
a first amplifier block connected to receive first and second input voltage signals, and connected to produce a first output current on first and second output current terminals, the magnitude of said first output current being controlled by a fixed DC biasing current driving said first amplifier block so as to determine a fixed gain thereof;
a second amplifier block connected to receive said first and second input voltage signals, and connected to produce a second output current on said first and second output current terminals, the magnitude of said second output current being controlled by a variable DC biasing current driving said second amplifier block so as to determine a variable gain thereof, the value of said variable DC biasing current being a combination of said fixed DC biasing current and of a variable current, controlled by an external control signal, and the DC part of said second output current depending only on said fixed DC biasing current;
a detector to detect the value of said output voltage from said variable gain amplifier and to provide an output signal accordingly;
a current generator connected to be driven by said detector and to produce a control current the magnitude and the sense thereof depending on said output signal from said detector;
a capacitor connected to be charged by said control current and to produce said external control signal.

39. An automatic gain control system, comprising:
a variable gain amplifier, including
a first fixed gain amplifier;
a second variable gain amplifier;
a variable current generator, connected to vary the gain of said second variable gain amplifier;
said first and second amplifiers being connected to operate in parallel to receive an input signal, and said first and second amplifier and said variable current generator being connected to produce a combination output signal, wherein the DC part of said combination output signal is constant;
said variable gain amplifier being controlled by a control input to produce a variable gain signal;
a level detector, connected to receive said combination output signal, and operatively connected to control said control input of said variable gain amplifier in dependence on said combination output signal.

* * * * *

UNITED STATES PATENT AND TRADEMARK OFFICE
CERTIFICATE OF CORRECTION

PATENT NO. : 5,418,494

DATED : May 23, 1995

INVENTOR(S) : Giorgio Betti; David Moloney, Salvatore Portaluri

It is certified that error appears in the above-indentified patent and that said Letters Patent is hereby corrected as shown below:

In the drawings figure 5 should be deleted to appear as per attached figure 5.

Signed and Sealed this

Sixteenth Day of September, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO : 5,418,494
DATED : May 23, 1995
INVENTOR(S): Giorgio Betti; David Moloney, Salvatore Portaluri It is certified that error appears in the above-identified patent and that said Letters Patent are hereby corrected as shown below:

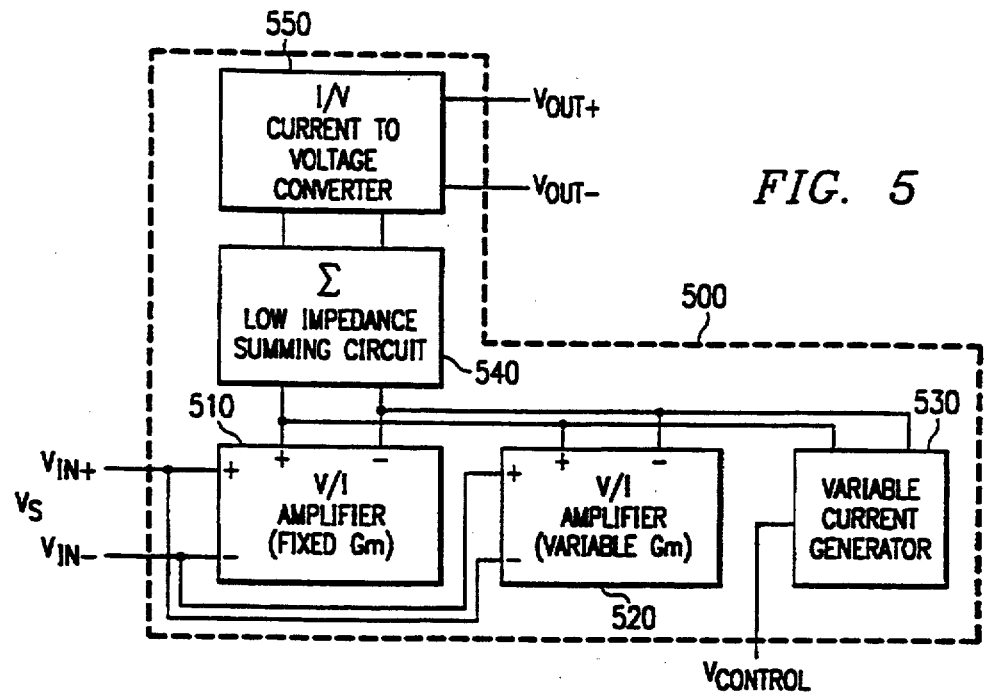

*FIG. 5*